United States Patent
Shiraishi

(10) Patent No.: US 7,094,518 B2
(45) Date of Patent: Aug. 22, 2006

(54) PHOTOSENSITIVE LITHOGRAPHIC PRINTING PLATE

(75) Inventor: Yuichi Shiraishi, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 1 day.

(21) Appl. No.: 10/755,372

(22) Filed: Jan. 13, 2004

(65) Prior Publication Data
US 2004/0146804 A1    Jul. 29, 2004

(30) Foreign Application Priority Data
Jan. 14, 2003    (JP) .................... P.2003-006094

(51) Int. Cl.
*G03F 7/027* (2006.01)
*G03F 7/028* (2006.01)
*G03F 7/032* (2006.01)

(52) U.S. Cl. ............... 430/281.1; 430/273.1; 430/286.1

(58) Field of Classification Search ............. 430/270.1, 430/271.1, 283.1, 281.1, 286.1, 287.1, 288.1, 430/273.1
See application file for complete search history.

(56) References Cited

U.S. PATENT DOCUMENTS

| 6,114,089 A | * | 9/2000 | Takita et al. ............. 430/278.1 |
| 6,440,633 B1 | * | 8/2002 | Kawauchi ................ 430/270.1 |
| 6,716,569 B1 | * | 4/2004 | Hotta et al. ................. 430/302 |
| 2005/0074687 A1 | * | 4/2005 | Hotta et al. .............. 430/270.1 |
| 2005/0118452 A1 | * | 6/2005 | Nishino et al. ............. 428/667 |

FOREIGN PATENT DOCUMENTS

| EP | 1 276 013 A2 | * | 1/2003 |
| JP | 4-274429 A | | 9/1992 |
| JP | 7-159983 A | | 6/1995 |
| JP | 9-34104 A | | 2/1997 |
| JP | 2000-105462 | * | 4/2000 |

* cited by examiner

Primary Examiner—Barbara L. Gilliam
(74) Attorney, Agent, or Firm—Sughrue Mion, PLLC

(57) ABSTRACT

A photosensitive lithographic printing plate comprising: a substrate having a hydrophilic surface; an intermediate layer which contains a compound having a quaternary ammonium group and an acid anion group in a single molecule; and a photopolymerizable photosensitive layer, in this order.

16 Claims, No Drawings

PHOTOSENSITIVE LITHOGRAPHIC PRINTING PLATE

FIELD OF THE INVENTION

The present invention relates to a photosensitive lithographic printing plate which is suitable for laser drawing and excellent in the development properties and stain resistance in a non-image part and the printing tolerance in an image part.

BACKGROUND OF THE INVENTION

It has been a practice to obtain a lithographic printing plate by forming a photosensitive resin layer on a substrate having hydrophilic surface, subjecting the thus obtained photosensitive lithographic printing plate to plane exposure (mask exposure) via a lith film and then removing non-image parts by using a developing solution. Owing to the recent digitalization techniques, however, there have been developed computer to plate (CTP) systems whereby a printing plate is directly exposed, without resort to a lith film, by scanning highly directional light such as laser beams on the printing plate in accordance with digitalized image data. Also, there have been developed photosensitive lithographic printing plates appropriate for these systems.

As an example of such photosensitive lithographic printing plates appropriate for laser exposure, a photosensitive lithographic printing plate with the use of a photopolymerizable photosensitive layer can be cited. This is because the sensitivity of a photopolymerizable photosensitive layer can be easily elevated by selecting an appropriate initiator or an appropriate initiation system, compared with other existing photosensitive layers. In such a photopolymerizable photosensitive layer, however, high printing tolerance due to the adhesiveness to the substrate mainly in an image part and favorable printing properties and stain resistance in a non-image part can be hardly achieved at the same time. Thus, various attempts have been made to solve this problem.

As one of these attempts, it is disclosed to employ a diazo compound as an adhesive in a photopolymerizable photosensitive layer (see, for example, JP-A-4-274429). In general, a diazo compound is excellent in the adhesiveness in a negative type photosensitive layer. By combining a diazo compound with a developing solution, improved development properties can be established. However, a diazo compound itself has a low sensitivity and cannot impart a sufficient printing tolerance particularly in a CTP exposure system.

It is also disclosed to form a sol-gel intermediate layer having a polymerizable group (see, for example, JP-A-7-159983). According to this method, favorable printing tolerance can be surely obtained. However, there arise other problems such as insufficient development properties under some development conditions and the occurrence of stains in a non-image part.

Moreover, it is disclosed to use a hydrophilic compound having an ethylenically unsaturated bond (see, for example, JP-A-9-34104). Due to the strongly hydrophilic nature, however, such a compound is frequently affected by dampening water in the step of printing, which brings about another problem that no sufficient printing tolerance can be obtained.

SUMMARY OF THE INVENTION

Therefore, an object of the invention is to provide a photosensitive lithographic printing plate which is free from the problems encountering in the related art as described above and has excellent printing tolerance in an image part as well as favorable development properties and stain resistance in a non-image part, and a method of constructing a lithographic printing plate.

The inventors have conducted intensive studies to achieve the above-described object. As a result, they have found out that the above-described object can be achieved by providing an intermediate layer containing a specific, compound between a substrate and a photosensitive layer, thereby completing the invention.

Accordingly, the invention relate to a photosensitive lithographic printing plate characterized by comprising, on a substrate having hydrophilic surface, an intermediate layer which contains a low-molecular weight compound having a quaternary ammonium group and an acid anion group in a single molecule and a photopolymerizable photosensitive layer in this order.

Using the above-described technique, it becomes possible to provide a photosensitive lithographic printing plate which is suitable for laser drawing and has excellent printing tolerance in an image part as well as favorable development properties and stain resistance in a non-image part.

DETAILED DESCRIPTION OF THE INVENTION

The mode of an embodiment of the invention will be illustrated.

In the photosensitive lithographic printing plate according to the invention, an intermediate layer which contains a low-molecular weight compound having a quaternary ammonium group and an acid anion group in a single molecule is formed on a substrate having hydrophilic surface and a photopolymerizable photosensitive layer is further formed thereon.

(Intermediate Layer)

One of the characteristics of the invention resides in that an intermediate layer which contains a low-molecular weight compound having a quaternary ammonium group and an acid anion group in a single molecule is formed.

The low-molecular weight compound having a quaternary ammonium group and an acid anion group in a single molecule to be used in the intermediate layer according to the invention is represented by the following formula (1):

Formula (1)

In the above formula (1), $R_1$, $R_2$ and $R_3$ independently represent each an optionally substituted alkyl group. It is preferable that the alkyl group has from 1 to 50, still preferably from 1 to 30, carbon atoms. Examples of the substituent include halogens, a hydroxyl group, alkoxy groups, an amino group, alkylamino groups, a cyano group, esters, urethane, and amides, though the invention is not restricted thereto. $R_1$ and $R_2$ may form together an optionally substituted 5-membered heterocycle or an optionally substituted 6-membered heterocycle. Alternatively, $R_1$, $R_2$ and $R_3$ may all together form an optionally substituted pyridine ring. Z represents a divalent linking group. Y represents an acid anion group. As examples of the divalent linking group represented by Z, optionally substituted alkylene groups having from 1 to 10 carbon atoms may be cited.

Among them, compounds wherein two of $R_1$, $R_2$ and $R_3$ are methyl groups or $R_1$, $R_2$ and $R_3$ all together form a pyridine ring are preferred. Preferable examples of z are alkylene groups having from 1 to 5 carbon atoms. Preferable examples of X are a carboxylate anion, a sulfonate anion and an oxyslfonate anion. Also, it is appropriate to use a compound having a polymerizable unsaturated double bond in its molecule.

It is preferable that this compound has a molecular weight of 2000 or less. By controlling the molecular weight to 2000 or less, sufficient development properties can be obtained.

Specific examples of the low-molecular weight compound having a quaternary ammonium group and an acid anion group in a single molecule to be used in the intermediate layer according to the invention are as follows, though the invention is not particularly restricted thereto.

Compound 1
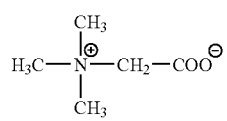

Compound 2
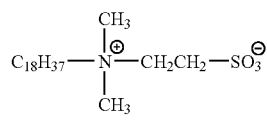

Compound 3
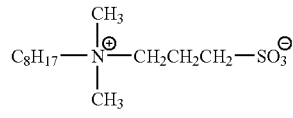

Compound 4
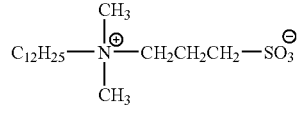

Compound 5
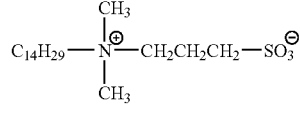

Compound 6
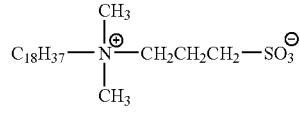

Compound 7
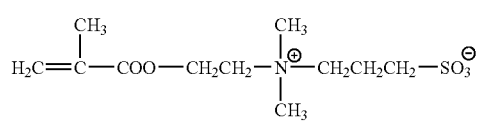

Compound 8
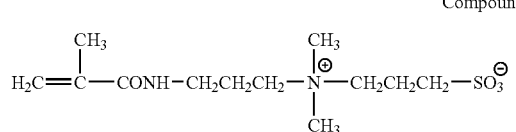

-continued

Compound 9
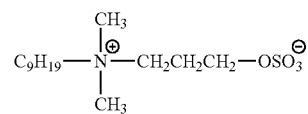

Compound 10
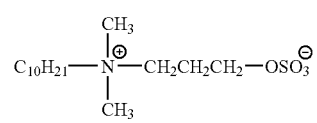

Compound 11
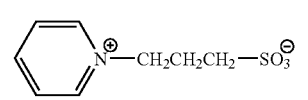

Compound 12
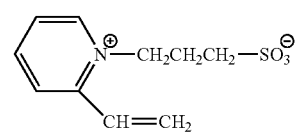

Compound 13
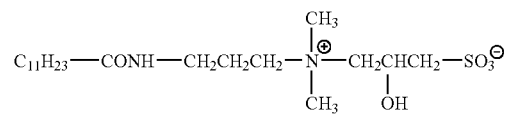

Compound 14
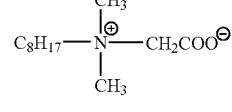

Compound 15
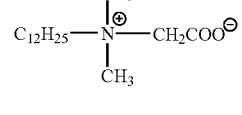

Compound 16
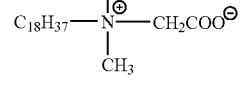

Compound 17
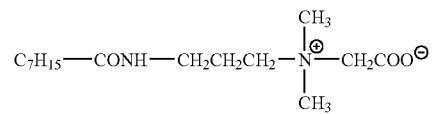

Compound 18
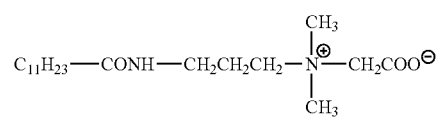

Compound 19
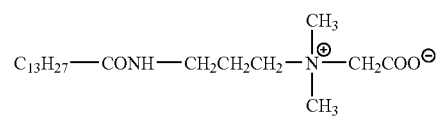

Compound 20
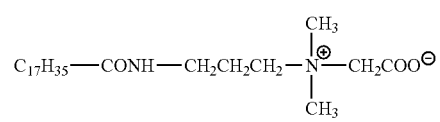

-continued

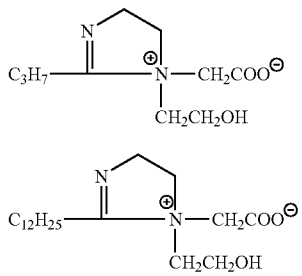

Compound 21

Compound 22

The intermediate layer in the photosensitive lithographic printing plate precursor according to the invention can be formed by the following methods. Namely, one method comprises dissolving the above-described compound in water, an organic solvent such as methanol or ethanol, or a mixture thereof and then applying the resultant solution on a substrate having hydrophilic surface followed by drying to thereby form an intermediate layer. Another method comprises dissolving the above-described compound in water, an organic solvent such as methanol or ethanol, or a mixture thereof and then dipping a substrate having hydrophilic surface in the resultant solution to thereby adsorbing the above-described compound followed by washing and by drying, thereby forming an intermediate layer. In the former method, a coating solution having the above-described compound dissolved therein at a concentration of form 0.005 to 10% by weight can be applied by various methods. That is to say, use may be made of any of the bar coater method, the spin coating method, the spray coating method, the curtain coating method and so on. In the method wherein the substrate is dipped in the solution containing the compound according to the invention dissolved therein and washed with, for example, water, the concentration of the solution ranges from 0.01 to 20% by weight, preferably from 0.05 to 5% by weight, the dipping temperature ranges from 20° C. to 90° C., preferably from 25° C. to 50° C., and the dipping time ranges from 0.1 sec to 20 min, preferably from 2 sea to 1 min.

It is appropriate that the coating amount after drying of the intermediate layer is from 0.1 mg/m$^2$ to 200 mg/m$^2$. In the case where the coating amount is less than 0.1 mg/m$^2$, the function as an intermediate layer cannot be exerted. When the coating amount exceeds 200 mg/m$^2$ on the contrary, the adhesion force is lowered and the printing tolerance is worsened. It is preferable that the coating amount ranges from 0.5 mg/m$^2$ to 100 mg/m$^2$, still preferably from 1 mg/m$^2$ to 50 mg/m$^2$.

To the intermediate layer of the photosensitive lithographic printing plate precursor according to the invention, it is possible to further add publicly known components, for example, carboxymethylcellulose, dextrin, gum arabic, amino group-containing phosphonic acids such as 2-aminoethylphosphonic acid, amino acids such as glycine and β-alanine and hydroxyl group-containing amine hydrochlorides such as triethanolamine hydrochloride. Furthermore, a binder polymer, a photopolymerizable confound, a photopolymerization initiator or a heat polymerization inhibitor may be added thereto.

It is desirable that the intermediate layer according to the invention contains the above-described low-molecular weight compound having a quaternary ammonium group and an acid anion group in a single molecule in an amount of at least 20% by weight, still desirably 50% by weight or more and most desirably 80% by weight or more.

(Substrate)

As the substrate of the photosensitive lithographic printing plate precursor according to the invention, use is made of a publicly known substrate having hydrophilic surface which is employed in lithographic printing plate precursors. It is particularly appropriate to use an aluminum substrate having hydrophilic surface. The aluminum substrate to be used is preferably in the form of a plate having a high dimensional, stability. It is preferable to use a plate made of pure aluminum or a plate made of an alloy which comprises aluminum as the main component together with a trace amount of a different element. It is also possible to use a plastic film having aluminum laminated or vapor-deposited thereon. Examples of the different element contained in the aluminum alloy include silicon, iron, manganese, copper, magnesium, chromium, zinc, bismuth, nickel, titanium, etc. The content of such a different element in the alloy amounts to 10% by weight at the largest. Although pure aluminum is particularly appropriate in the invention, completely pure aluminum can be hardly produced from the viewpoint of refining techniques. Thus, use may be made of one containing a small amount of a different element. That is to say, the composition of the aluminum plate to be used in the invention is not restricted and thus aluminum plates having been known and employed in the art can be appropriately employed therefor. The thickness of the aluminum plate to be used in the invention ranges from about 0.05 mm to 1.0 mm, preferably from 0.1 mm to 0.6 mm and still preferably from 0.12 mm to 0.4 mm.

The aluminum substrate in the invention is surface-treated by, for example, surface roughening (sand blasting) or anode oxidation to give a substrate having hydrophilic surface.

Before surface-roughening, the aluminum plate is degreased with the use of, for example, a surfactant, an organic solvent or an alkaline aqueous solution, if desired, to remove press oil from the surface. The surface-roughening treatment of the aluminum plate may be carried out by various methods. For example, a mechanical surface-roughening method, an electrochemical surface-dissolving/roughening method or a chemical method of selectively dissolving the surface may be employed. As the mechanical method, use may be made of a publicly known method such as ball polishing, brush polishing, blast polishing or buff polishing. The electrochemical surface-roughening may be carried out with the use of an alternate current or a direct current in a liquid electrolyte such as hydrochloric acid or nitric acid. Moreover, it is possible to employ a method of combining them as disclosed in JP-A-54-63902. The aluminum substrate thus surface-roughened is then chemically etched with an acid or an alkali. Alkali etching is preferred and use may be made of caustic soda, sodium carbonate, sodium aluminate, sodium metasilicate, sodium phosphate, potassium hydroxide, lithium hydroxide, etc. After the completion of the alkali etching, stains (smuts) remaining on the surface are removed by washing with an acid such as nitric acid, sulfuric acid or phosphoric acid (i.e., desmutting). The surface roughness of the aluminum substrate thus obtained preferably ranges from 0.1 to 1.0 μm, still preferably from 0.2 to 0.8 μm.

The anode oxidation treatment of the aluminum plate can be performed by passing an electric current with the use of the aluminum plate as an anodes in a liquid electrolyte comprising, for example, an aqueous solution or a non-aqueous solution of an inorganic acid such as phosphoric acid, chromic acid, sulfuric acid or boric acid, an organic acid such as oxalic acid or sulfamic acid, or a salt thereof or a combination of the same. It is also useful to employ a surface treatment with the combined use of electrolysis grains with the above-described anode oxidation treatment as disclosed by JP-B-46-27481, JP-A-52-58602 and JP-A-52-30503. Moreover, use may be appropriately made of a process wherein mechanical surface roughening, chemical etching, a treatment with electrolysis grains and anode oxidation are successively carried out, as disclosed by JP-A-56-28893.

Although the surface of the substrate thus obtained has been already made hydrophilic, an additional treatment may be further performed. As an exile of such a treatment, a sealing treatment may be cited. The sealing treatment is carried out by dipping the aluminum substrate, which has been subjected to the anode oxidation, in hot water or a hot aqueous solution containing an inorganic salt or an organic salt, or spraying water vapor to the aluminum substrate which has been subjected to the anode oxidation. As further hydrophilication treatment, the aluminum substrate which has been subjected to the anode oxidation may be dipped in an aqueous solution of an alkali metal silicate or polyvinylsulfonic acid.

On the aluminum substrate which has been surface-treated as described above, an intermediate layer containing a compound having an alkali-soluble group and an ethylenically unsaturated double bond and a photosensitive layer comprising a photopolymerizable composition are successively formed. Thus, the photosensitive lithographic printing plate according to the invention is obtained.

(Photopolymerizable Photosensitive Layer)

The photopolymerizable photosensitive layer (hereinafter sometimes referred to simply as the photosensitive layer) which is formed on the above-described intermediate layer in the photosensitive lithographic printing plate according to the invention preferably contains a compound having an ethylenically unsaturated bond capable of undergoing addition polymerization, a photopolymerization initiator (system) and a high-molecular weight binder (polymer binder) as the essential components optionally together with other various additives.

The compound having an ethylenically unsaturated bond capable of undergoing addition polymerization to be used in the photosensitive layer of the photosensitive lithographic printing plate according to the invention is selected from among compounds having at least one, preferably two or more terminal ethylenic unsaturated bonds. These compounds, which are widely known in the art, can be used in the invention without particular restriction. Such a compound is in the chemical form of, for example, a monomer, a prepolymer (i.e., a dimer, a trimer or an oligomer), a mixture thereof, a copolymer thereof and the like.

Examples of the monomer and the copolymer thereof include unsaturated carboxylic acids (for example, acrylic acid, methacrylic acid, itaconic acid, crotonic acid, isocrotonic acid, maleic acid, etc.) and esters and amides thereof. It is preferable to use an ester of an unsaturated carboxylic acid with an aliphatic polyhydric alcohol compound or an amide of an unsaturated carboxylic acid with an aliphatic polyvalent amine. It is also appropriate to use an addition reaction product of an unsaturated carboxylic acid ester or amide having a nucleophilic substituent such as a hydroxyl group, an amino group or a mercapto group with a monofunctional or polyfunctional isocyanate or an epoxy compound, a dehydrating condensation product with a mono-functional or polyfunctional carboxylic acid, etc. Furthermore, it is also appropriate to use an addition reaction product of an unsaturated carboxylic acid ester or amide having an electrophilic substituent such as an isocyanate group or an epoxy group with a monofunctional or polyfunctional alcohol, amine or thiol, and a substitution reaction product of an unsaturated carboxylic acid ester or amide having a leaving substituent such as a halogen group or a tosyloxy group with a monofunctional or poly-functional alcohol, amine or thiol. Alternatively, it is also possible to use compounds wherein the above-described unsaturated carboxylic acid is replaced by unsaturated phosphonic acid, styrene, vinyl ether, etc.

Specific examples of the unsaturated carboxylic acid ester with an aliphatic polyhydric alcohol compound include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane (acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomers and so on.

Examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl] dimethylmeth ane, bis [p-(methacryloxyethoxy) phenyl] dimethylmethane and so on.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate and so on.

Examples of crotonic acid esters include ethylene glycol dicrotonate, tetramethylene glycol dicrotonate, pentaerythritol dicrotonate, sorbitol tetradicrotonate and so on.

Examples of isocrotonic acid esters include ethylene glycol diisocrotonate, pentaerythritol diisocrotonate, sorbitol tetraisocrotonate and so on.

Examples of maleic acid esters include ethylene glycol dimaleate, triethylene glycol dimaleate, pentaerythritol dimaleate, sorbitol tetramaleate and so on.

As other esters, use can be appropriately made of, for example, aliphatic alcohol esters described in JP-B-46-27926, JP-B-51-47334 and JP-A-57-196231, those having aromatic skeleton described in JP-A-59-5240, JP-A-59-5241 and JP-B-2-226149, those having an amino group described in JP-A-1-165613 and so on.

Moreover, the above-described ester monomers may be used as a mixture.

Specific examples of the amide monomer of an aliphatic polyvalent amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetrisacrylamide, xylylenebisacrylamide, xylylenebismethacrylamide and so on.

Examples of other preferable amide monomers include those having a cyclohexylene structure described in JP-B-54-21726.

Furthermore, use may be appropriately made of a urethane-type addition polymerizable compound produced by an addition reaction between an isocyanate and a hydroxyl group. Specific examples thereof include a vinyl urethane compound having two or more polymerizable vinyl group per molecule which is obtained by adding a vinyl monomer having a hydroxyl group as represented by the following formula (2) to a polyisocyanate compound having two or more isocyanate groups per molecule, as reported in JP-B-48-41708.

$$CH_2=C(R^4)COOCH_2CH(R^5)OH \quad \text{formula (2)}$$

wherein $R^4$ and $R^5$ independently represent each H or $CH_3$.

Also, use may be appropriately made of urethane acrylates described in JP-A-51-37193, JP-B-2-32293 and JP-B-2-16765 and urethane compounds having an ethylene oxide skeleton described in JP-B-58-49860, JP-B-56-17654, JP-B-62-39417 and JP-B-62-39418.

Furthermore, photopolymerizable compositions having an excellent photosensitization speed can be obtained by using addition polymerizable compounds having an amino structure or a sulfide structure in a molecule as described in JP-A-63-277653, JP-A-63-260909 and JP-A-1-105238.

As further examples, polyfunctional acrylates and methacrylates such as polyester acrylates and epoxy acrylates obtained by reacting an epoxy resin with (meth) acrylic acid as described in JP-A-48-64183, JP-B-49-43191 and JP-B-52-30490 can be cited. Moreover, citation may be made of specific unsaturated compounds described in JP-B-46-43946, JP-B-1-40337 and JP-B-1-40336 and a vinylphospholic acid-based compound described in JP-A-2-25493. In some cases, it is appropriate to use a structure having a perfluoroalkyl group as described in JP-A-61-22048 Furthermore, it is possible to use photosetting monomers and oligomers reported in Nippon Secchaku Kyokai-shi, vol.20, No.7, pp 300–308 (1984).

Two or more of these ethylenically unsaturated bond-containing compounds capable of undergoing addition polymerization maybe used together in the photosensitive layer. The amount of such addition polymerizable compound(s) preferably ranges from 5 to 80% by weight, still preferably from 20 to 75% by weight, based on the all components of the photosensitive layer.

As the photopolymerization initiator (system), use can be made of a single photopolymerization initiator or a system comprising a combination of two or more photopolymerization initiators (a photopolymerization initiator system) appropriately selected, based on the wavelength of the light source to be used, from among various photopolymerization initiators which have been publicly known in patents, documents, etc.

In the cas of using a the light source visible rays, an Ar laser, the second harmonic of a semiconductor laser or an SHG-YAG laser, there have been proposed various photopolymerization initiators (systems). Examples thereof include a system comprising a combination of a specific photoreducing dye described in U.S. Pat. No. 2,850,445 such as rosebengal, eosin or erythrosin or a dye with an initiator, for example, a composite initiator system comprising a dye with an amine (JP-B-44-20189), a system comprising a combination of hexaarylbiimidazole with a radical generator (JP-B-45-37377), a system comprising hexaarylbiimidazole with a p-dialkylaminobenzylidene ketone (JP-B-47-2528 and JP-A-54-155292), a system comprising a cyclic cis-α-dicarbonyl compound with a dye (JP-A-48-84183), a system comprising a cyclic triazine with merocyanine (JP-A-54-151024), a system comprising 3-ketocoumarin with an active agent (JP-A-52-112681 and JP-A-58-15503), a system comprising biimidazole, a styrene derivative and thiol (JP-A-59-140203), a system comprising an organic peroxide with a dye (JP-A-59-1504, JP-A-59-140203, JP-A-59-189340. JP-A-62-174203, JP-B-62-1641 and U.S. Pat. No. 4,766,055), a system comprising a dye with an active halogen compound (JP-A-63-1718105, JP-A-63-258903, JP-A-2-63054, etc.), a system comprising a dye with a borate compound (JP-A-62-143044, JP-A-62-150242, JP-A-64-13140, JP-A-64-13141, JP-A-64-13142, JP-A-64-13143, JP-A-64-13144, JP-A-64-17048, JP-A-1-229003, JP-A-1-298348, JP-A-1-138240, etc.), a system comprising a dye having a rhodanine ring with a radical generator (JP-A-2-179643 and JP-A-2-244050), a system comprising a titanocene with 3-ketocoumarin (JP-A-63-221110), a system comprising a titanocene and a xanthene dye further combined with an ethylenically unsaturated compound capable of undergoing addition polymerization and having an amino group or an urethane group (JP-A-4-221958 and JP-A-4-219756), a system comprising a titanocene with a specific merocyanine dye (JP-A-6-295061), a system comprising a titanocene with a dye having a benzopyrane dye (JP-A-8-334897) and so on.

With the recent development of lasers of wavelength of 400 to 410 nm (violet lasers), there have been developed photoinitiator systems highly sensitive to wavelengths of 450 nm or less. It is also possible to use these photoinitiator systems. Examples thereof include a merocyanine dye/titanocene system (JP-A-2000-147763), a carbazole dye/titanocene system (JP-A-2001-42524), a merocyanine dye/trihalomethyl-s-triazine compound system, a carbazole dye/trihalomethyl-s-triazine compound system and so on.

Among these photopolymerization initiators (systems), it is preferable use those containing at least one type selected from titanocene and triazine (more preferably, titanocene). As the titanocene compounds, it is possible to use various ones. For example, use can be made of one appropriately selected from among publicly known compounds described in JP-A-59-152396, JP-A-61-151197, JP-A-63-41483, JP-A-63-41484, JP-A-2-249, JP-A-2-291, JP-A-3-27393, JP-A-3-12403 and JP-A-6-41170. More specifically speaking, use can be made of di-cyclopentadienyl-Ti-di-chloride, di-cyclopentadienyl-Ti-bis-phenyl, di-cyclopentadienyl-Ti-bis-2,3,4,5,6-pentafluorophen-1ˆyl (hereinafter also referred to as "T-1"), di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-diflurorphen-1-yl, di-methylcyclopentadienyl-Ti-bis-2,3,4,5,6-pentafluorophen-1-yl, di-methylcyclopentadienyl-Ti-bis-2,315,6-tetrafluorophen-1-yl, di-methylcyclopentadienyl-Ti-bis-2,4-difluorophen-1-yl, bis (cyclopentadienyl)-bis (2,6-difluoro-3-(pir-1-yl) phenyl) titanium (hereinafter also referred to as "T-2"), etc.

Examples of the dyes to be combined with titanocences include cyanine dyes, merocyanine dyes, xanthene dyes, ketocoumarin dyes, benzopyran dyes and carbazole dyes as described above. Specific examples of the dyes include the above-described dyes described in JP-A-63-221110, JP-A-4-22198, JP-A-4-219756, JP-A-6-295061, JP-A-8-334897, JP-A-2000-147763, JP-A-2000-42524 and Japanese Patent Application 2001-237436, though the invention is not restricted thereto.

If necessary, it is known that the photoinitiation ability can be further elevated by adding a hydrogen donating compound, for example, a thiol compound such as 2-mercaptobenzthiazole, 2-mercaptobenzimidazole or 2-mercaptobenzoxazole or an amine compound such as N-phenylglycine or an N,N-dialkylamino aromatic alkyl ester.

In the case of using a high-pressure mercury lamp, an ultrahigh pressure mercury lamp, a metal halide lamp, etc. as the exposure light source, examples of the photopolymerization initiator include a vicinal polyketaldonyl compound described in U.S. Pat. No. 2,367,660, an α-carbonyl compound described in U.S. Pat. No. 2,367,661 and U.S. Pat. No. 2,367,670, an acyloin ether described in U.S. Pat. No. 2,448,828, an aromatic acyloin compound substituted at the α-position by a hydrocarbon as described in U.S. Pat. No. 2,722,512, a polynucleic quinone compound described in U.S. Pat. No. 3,046,127 and U.S. Pat. No. 2,951,758, a combination of triarylimidazole dimer/p-aminophenyl ketone described in U.S. Pat. No. 3,549,367, a benzothiazole compound described in U.S. Pat. No. 3,870,524, a benzothiazole compound and a trihalomethyl-s-triazine compound described in U.S. Pat. No. 4,239,859, an acridine compound and a fenadine compound described in U.S. Pat. No. 3,751,259, an oxadiazole compound described in U.S. Pat. No. 4,212,970 and so on.

Such a photopolymerization initiator (system) is used usually in an amount of from 0.05 to 100 parts by weight, preferably from 0.1 to 70 parts by weight and still preferably from 0.2 to 50 parts by weight, per 100 parts by weight of the ethylenically unsaturated bond-containing compound capable of undergoing addition polymerization in the photosensitive layer.

The high-molecular weight binder to be used in the photosensitive layer of the photosensitive lithographic printing plate according to the invention should serve as a film-forming agent in the composition. It is also required that this binder is soluble in an alkali developing solution. Therefore, an organic high-molecular weight polymer which is soluble in an aqueous solution of an alkali or swells therein is employed therefor. By using, for example, a water-soluble organic high-molecular weight polymer as the organic high-molecular weight polymer, water development can be carried out. Examples of the organic high-molecular weight polymer include addition polymers having a carboxylic group in a side chain described in, for example, JP-A-59-44615, JP-B-54-34327, JP-B-58-12577, JP-B-54-25957, JP-A-54-92723, JP-A-59-53836 and JP-A-59-71048, i.e., methacrylic acid copolymers, acrylic acid copolymers, itaconic acid copolymers, crotonic acid copolymers, maleic acid copolymers, partially esterified maleic acid copolymers and so on. Among all, it is particularly appropriate to use [benzyl (meth)acrylate/(meth)acrylic acid/optionally together with other addition polymerizable vinyl monomer] copolymers and [allyl (meth)acrylate (meth)acrylic acid/optionally together with other addition polymerizable vinyl monomer] copolymers.

Also, there are acidic cellulose derivatives having a carboxylic acid in a side chain. Further, additional polymers having a hydroxyl group to which a cyclic acid anhydride is added are useful. Furthermore, polyvinylpyrrolidone, polyethylene oxide, etc. are also useful as water-soluble organic high-molecular weight polymers to enhance the strength of the hardened film, alcohol-soluble polyamides, a polyether of 2,2-bis-(4-hydroxyphenyl)-propane with epichrolohy-drin, etc. are also useful. In addition, polyurethane resins described in JP-B-7-120040, JP-B-7-120041, JP-B-7-120042, JP-B-8-12424, JP-A-63-287944, JP-A-63-287947, JP-A-1-271741 and JP-A-11-352961 are useful for the purpose of the invention.

The strength of the hardened film can be enhanced by introducing a radical reactive group into a side chain of such an organic high-molecular weight polymer. Examples of the functional group capable of undergoing the addition polymerization include ethylenically unsaturated bond groups, an amino group, an epoxy group, etc. Examples of the functional group capable of serving as a radical when irradiated with light include a mercapto group, a thiol group, halogen atoms, a triazine structure, an onium salt structure, etc. Examples of a polar group include a carboxyl group and an imide group. As the addition polymerizable functional group as described above, ethylenically unsaturated bond groups such as an acryl group, a methacryl group, an allyl group and a stryl group are particularly preferable. However, functional groups selected from among an amino group, a hydroxy group, a phosphonate group, a phosphate group, a carbamoyl group, an isocyanate group, an ureido group, an ureilene group, a sulfonate group and an ammonio group are also useful.

To maintain the developing properties of the composition, it is preferable that the above-described high-molecular weight binder has an appropriate molecular weight and an appropriate acid value. That is to say, a high-molecular weight binder having a weight-average molecular weight of from 5000 to 300,000 and an acid value of from 20 to 200 can be effectively employed. Such a high-molecular weight binder can be blended in an arbitrary amount with the whole composition. From the viewpoint of the strength of the formed image, etc., the content of the high-molecular weight binder preferably ranges from 10 to 90% by weight, still preferably from 30 to 80% by weight. It is also preferable that the ratio by weight of the photopolymerizable ethylenically unsaturated bond-containing compound to the high-molecular weight binder ranges from 1/9 to 9/1, still preferably from 2/8 to 8/2 and still preferably from 3/7 to 7/3.

The photosensitive layer may further contain other additive(s). To color the photosensitive layer, it is preferable to add a colorant. Examples of the colorant include pigments such as phthalocyanine pigments (C.I. Pigment Blue 0.15:3, 15:4, 15:6, etc.), azo pigments, carbon black and titanium oxide, ethyl violet, crystal violet, azo dyes, anthraquinone dyes, cyanine dyes and so on. It is preferable that the content of such a dye and pigment ranges from about 0.5% by weight to about 20% by weight in the whole composition.

In addition, the photosensitive layer may contain additives, for example, an inorganic filler such as calcium carbonate or silica gel and a plasticizer such as dioctyl phthalate, dimethyl phthalate or tricresyl phosphate to improve the physical properties of the hardened film. It is preferable that the content of these additives is not more than 10% by weight of the whole composition.

To improve the coated face qualities of the photosensitive layer, a surfactant may be added thereto. As the surfactant to be used, a fluorine-based surfactant is favorable.

To prevent unnecessary heat polymerization of the polymerizable ethylenically unsaturated bond-containing compound in the course of the production or storage of the photosensitive layer, it is desirable to add a small amount of a heat polymerization inhibitor. Appropriate examples of the heat polymerization inhibitor include hydroquinone, p-methoxyphenol, di-t-butyl-p-cresol, pyrogallol, t-butyl catechol, benzoquinone, 4,4-thiobis(3-methyl-6-t-butylphenol), 2,2'-,methylenebis (4-methyl-6-t-butylphenol), N-nitrosophenyl hydroxylamine primary cerium salt, N-nitrosophenylhydroxylamine aluminum salt and so on, It is preferable to add the heat polymerization inhibitor in an amount of from 0.001% to about 5% based on the weight (mass) of the whole composition.

If necessary, a higher fatty acid derivative, etc. such as behenic acid or behenic acid amide maybe added and localized on the surface of the photosensitive layer in the step of drying after the coating to thereby prevent the inhibition of polymerization by oxygen. It is preferable to add the higher fatty acid derivative, etc. in an amount of from about 0.5% by weight to about 10% by weight based on the whole composition.

Since it is disadvantageous from the viewpoint of sensitivity to add a diazo compound to the photosensitive layer, it is preferred not to add such a compound.

To form the photosensitive layer on the intermediate layer as described above, the materials to be used for the photosensitive layer are dissolved in an organic solvent selected from among various ones and applied by a publicly known method. Examples of the solvent usable herein include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethaonl, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether aceate-3-methoxypropyl acetate, N,N-dimethylformamide, dimethyl sulfoxide, γ-butyrolactone, methyl lactate, ethyl lactate, methanol, ethanol, isopropyl alcohol and so on. Either one of these solvents or a mixture thereof can be used. It is appropriate that the solid content in the coating solution ranges from 1 to 50% by weight. The photosensitive layer may further contain a small amount of purified water.

The coating amount of the photosensitive layer appropriately ranges from 0.1 to 10 g/m², preferably from 0.3 to 5 g/m² and still preferably from 0.5 to 3 g/m², in terms of the weight (mass) after drying, In the invention, it is preferable to provide a protective layer. And it is more preferable to provide an oxygen barrier protective layer containing a water-soluble vinyl polymer on the above-described photosensitive layer to prevent the polymerization inhibitory effect of oxygen.

Examples of the water-soluble vinyl polymer contained in the oxygen barrier protective layer include polyvinyl alcohol, partial esters, ethers and acetals thereof and copolymers thereof containing a substantial amount of an unsubstituted vinyl alcohol unit for imparting solubility in water thereto. Examples of the polyvinyl alcohol include those which are hydrolyzed to an extent of 71 to 100% and have a degree of polymerization ranging front 300 to 2400. More specifically speaking, use can be made of PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8, etc. manufactured by Kuraray. Examples of the above-described copolymers include polyvinyl acetate chloroacetate or propionate, polyvinyl formal and polyvinyl acetal and copolymers thereof each having been hydrolyzed to 88 to 100%. Furthermore, polyvinylpyrrolidone, gelatin and gum arabic can be cited as examples of useful polymers. Either one of these polymers or a combination thereof may be used.

As the solvent to be used in coating the oxygen-barrier protective lay r in the photosensitive lithographic printing plate according to the invention, it is preferable to employ purified water which may be mixed with an alcohol such as methanol or ethanol or a ketone such as acetone or methyl ethyl ketone. The concentration of solid matters in the coating solution appropriately ranges from 1 to 20% by weight.

Further, the above-described oxygen-barrier protective layer may contain publicly known additives, for example, a surfactant for improving the coating properties and a water-soluble plasticizer for improving the physical properties of the film. Examples of the water-soluble plasticizer include propionamide, cyclohexanediol, glycerol and sorbitol. A water-soluble (meth)acrylic polymers etc. may be added. The coating amount appropriately ranges from 0.1 to 15 g/m², preferably from 0.5 to 5.0 g/m², in terms of the weight (mass) after drying.

(Exposure)

The photosensitive lithographic printing plate according to the invention is subjected to image exposure with publicly known active rays such as a carbon arc lamp, a high-pressure mercury lamp, a xenon lamp, a metal halide lamp, a fluorescent lamp, a tungsten lamp, a halogen lamp, a helium cadmium laser, an argon ion laser, an FD YAG laser, a helium neon laser or a semiconductor laser (350 nm to 600 nm). Thus, an image can be formed on the surface of the aluminum plate substrate. A process of heating at 50° C. to 150° C. for 1 sec to 5 man may be introduced between the image exposure and the development so as to elevate the hardening rate of the photopolymerizable photosensitive layer.

As described above, an oxygen-barrier overcoat layer is usually formed on the photosensitive layer of the photosensitive lithographic printing plate according to the invention. There have been known a method wherein the overcoat layer is removed together with the unexposed parts of the photosensitive layer with the use of a developing solution as will be described hereinafter, and a method wherein the overcoat layer is first removed with cold or warm water and then the photosensitive layer in the unexposed part is removed by the development. The cold or warm water may contain a preservative, etc. as described in JP-A-10-10754 and an organic solvent, etc. as described in JP-A-8-278636.

(Development)

As the developing solution to be used in developing the photosensitive lithographic printing plate according to the invention, it is preferable to use one containing an inorganic alkali salt and a nonionic surfactant having a polyoxyalkylene ether group. It is still preferable that the developing solution has a pH value of 11.0 to 13.0.

An appropriate inorganic alkali salt may be used therein and examples thereof include inorganic alkali agents such as sodium hydroxide, Potassium hydroxide, ammonium hydroxide, lithium hydroxide, sodium silicate, potassium silicate, ammonium silicate, lithium silicate, sodium tertiary phosphate, potassium tertiary phosphate, ammonium tertiary phosphate, sodium carbonate, potassium carbonate, ammonium carbonate, sodium hydrogencarbonate, potassium hydrogencarbonate, ammonium hydrogencarbonate, sodium borate, potassium borate and ammonium borate. Either one of these inorganic alkali salts or a combination of two or more thereof may be used.

In the case of using a silicate, the development properties can be easily controlled by controlling the mixing ratio of the silicate with the inorganic alkali salt and the concentrations thereof. Concerning the mixing ratio, it is preferable that the molar ration $SiO_2/M_2O$ ranges from 0.5 to 3.0, still preferably from 1.0 to 2.0, in the case where the silicate and the inorganic alkali salt are respectively represented as the oxides $SiO_2$ and $M_2O$ (M represents an alkali metal or $NH_4$). When the mixing ratio is less than 0.5, the alkali strength is excessively elevated, which sometimes causes some troubles such that an aluminum plate commonly employed as the substrate of a photosensitive lithographic printing plate is etched thereby. When the mixing ratio exceeds 4.0, the development properties are worsened in some cases.

It is preferable that the concentration of $SiO_2$ in the developing solution ranges from 0.1 to 15% by weight, still preferably from 0.5 to 12% by weight and still preferably from 1 to 10% by weight and most desirably from 2 to 8% by weight, based on the total weight of the developing solution. When the concentration is 0.1% by weight or above, a sufficient treatment capability can be obtained. By regulating the concentration to 15% by weight or below, precipitation or crystallization can be prevented and the solution hardly sets to gel in the step of neutralizing the waste liquor, thereby causing no troubles in the waste disposal.

In order to delicately control the alkali concentration and promote the dissolution of the photosensitive layer, use maybe made of an organic alkali agent as a supplement. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, tetramethylammonium hydroxide and so on. Either one of these alkali agents or a combination of two or more thereof may be used.

It is preferable that the developing solution to be used in the invention contains a nonionic surfactant having a polyoxyalkylene ether group. By adding this surfactant, the dissolution of the photosensitive layer in the unexposed parts can be promoted and the permeability of the developing olution into the exposed parts can be lowered. As the surfactant having a polyoxyalkylene ether group, compounds represented by the following formula (3) are appropriately usable.

$$R^6\text{—}O\text{—}(R^7\text{—}O)_pH \quad (3)$$

In this formula, $R^6$ represents an optionally substituted alkyl group having from 3 to 0.15 carbon atoms, an optionally substituted aromatic hydrocarbon group having from 6 to 15 carbon atoms or an optionally substituted heteroaryl group having from 4 to 15 carbon atoms. Examples of the substituents include alkyl groups having from 1 to 20 carbon atoms, halogen atoms such as Br, Cl and I aromatic hydrocarbon groups having form 6 to 15 carbon atoms, aralkyl groups having from 7 to 17 carbon atoms, alkoxy groups having from 1 to 20 carbon atoms, alkoxycarbonyl groups having 2 to 20 carbon atoms, acyl groups having from 2 to 15 carbon atoms and so on. $R^7$ represents an optionally substituted alkylene group having from 1 to 100 carbon atoms. Examples of the substituent include alkyl groups having from 1 to 20 carbon atoms, aromatic hydrocarbon groups having from 6 to 15 carbon atoms and so on p is an integer of from 1 to 100.

Specific examples of the "aromatic hydrocarbon groups" in the definition of the above formula (3) include a phenyl group, a tolyl group, a naphthyl group, an anthryl group, a biphenyl group, a phenanthryl group and so on. Specific examples of the "heteroaryl group" include a furyl group, a thionyl group, an oxazolyl group, an imidazolyl group, a pyranyl group, a pyridinyl group, an acridinyl group, a benzofuranyl group, a benzothionyl group, a benzopyranyl group, a benzoxazolyl group, a henzoimidazolyl group and so on.

The part $(R^7\text{—}O)_p$ in the formula (3) may have two or three types of groups, so long as it falls within the range as defined above. Specific examples thereof include random or block polymers having an ethyleneoxy group combined with a propyleneoxy group, an ethyleneoxy group combined with an isopropyloxy group, an ethyleneoxy group combined with a butyleneoxy group, an ethyleneoxy group combined with an isobutylene group. In the invention, the surfactant having a polyoxyalkylene ether group is employed either alone or as a composite system. It is effective to add the surfactant in an amount of from 1 to 30% by weight, preferably from 2 to 20% by weight in the developing solution. When it is added in an excessively small amount, the development properties are worsened. When it is added too much, on the contrary, development damages become serious and the printing tolerance of the printing plate is worsened.

Examples of the nonionic surfactant having a polyoxyalkylene ether group represented by the above formula (3) include polyoxyethylene alkyl ethers such as polyoxyethylene lauryl ether, polyoxyethylene cetyl ether and polyoxyethylene stearyl ether, polyoxyethylene aryl ethers such as polyoxyethylene phenyl ether and polyoxyethylene naphthyl ether, and polyoxyethylene alkylaryl ethers such as polyoxyethylene methylphenyl ether, polyoxyethylene octylphenyl ether and polyoxyethylene nonylphenyl ether.

It is also possible to further add other surfactants as will be illustrated hereinafter. As these other surfactants, use can be made of nonionic surfactants including polyoxyethylene alkyl esters such as polyoxyethylene stearate, sorbitan alkyl esters such as sorbitan, monolaurate, sorbitan monostearate, sorbitan distearate, sorbitan monooleate, sorbitan sesquioleate and sorbitan trioleate and monoglyceride alkyl esters such as glycerol monostearate and glycerol monooleate; anionic surfactants including alkylbenzenesulfonaic acids such as sodium dodecylbenzenesulfonate, alkylnaphthalenesulfonic acids, such as sodium butylnaphthalenesulfonate, sodium pentylnaphthalenesulfonate, sodium hexylnaphthalenesulfonate and sodium octylnaphthalenesulfonate, alkylsulfuric acid salts such as sodium laurylsulfate, alkylsulfonicacid salts such as soda dodecylsulfonate, and sulfosuccinic acid ester salts such as sodium dilaurylsulfosuccinate; and amphoteric surfactants including alkyl betaines such as lauryl betaine and stearyl betaine, and amino acids. Among them, anionic surfactants such as alkylnaphthalenesulfonfic acid salts are particularly preferable.

Either one of these surfactants or a combination thereof may be used. It is appropriate that the content of such a surfactant in the developing solution ranges from 0.1 to 20% by weight in terms of the active component.

The developing solution to be used in the invention has a pH value of preferably from 11.0 to 13.0, still preferably from 11.5 to 12.5. By adjusting the pH value to 11.0 or a above, sufficient image formation properties can be obtained. By regulating the pH to 13.0 or below, a favorable development performance can be achieved.

It is preferable that the electrical conductivity of the developing solution to be used in the invention ranges from 3 to 30 mS/cm. By controlling the electrical conductivity to 3 mS/cm or above, the photosensitive composition can be sufficiently eluted on the aluminum substrate surface without the problem of printing stains. By regulating it to 30 mS/cm or below, the elution speed of the photosensitive layer is not extremely lowered and there arises no fear of the formation of film residues. It is particularly preferable that the electric conductivity falls within the range of form 5 to 20 mS/cm.

The development of the photosensitive lithographic printing plate according to the invention with the above-described developing solution is performed by dipping the photosensitive lithographic printing plate, which has been exposed, in the developing solution at a temperature of 0 to 60° C., preferably at about 15 to 45° C. and brushing in a conventional manner.

In the case of performing the development with the use of an automatic developing machine, the development solution would fatigue depending on the treating capacity. Thus, a supplemental solution or fresh developing solution maybe added to restore the treating capacity.

(Postdevelopment Treatment)

The photosensitive lithographic printing plate thus developed is subjected to a post-treatment with the use of washing water, a rinsing solution containing a surfactant, etc. and a grease-desensitizing solution containing gum arabic or a starch derivative, etc. as described in JP-A-54-8002, JP-A-55-115045, JP-A-59-58431, etc. To post-treat the photosensitive lithographic printing plate according to the invention, use can be made of an appropriate combination of these procedures.

The printing plate obtained by treating as described above may be subjected to a post-exposure treatment by the method as described in JP-A-2000-89478 or a heating treatment such as burning to thereby further improve the printing tolerance.

The printing plate obtained by these treatments is loaded on an offset printer and employed in printing.

EXAMPLES

The invention will be described in greater detail by reference to the following Examples. However, it is to be understood that the invention is not construed as being restricted thereto. Unless otherwise noted, all percentages are % by weight.

Example 1

An aluminum 1S plate of 0.30 mm in thickness was etched by spraying an aqueous solution of a sodium hydroxide concentration of 26% at a temperature of 70° C. thereto. Thus, the aluminum plate was etched at 5 g/m². Next, it was washed with running water, neutralized by washing with an aqueous solution of a nitric acid concentration of 1% at a temperature of 30° C. and then washed with water again. Then the surface of the plate was roughened by electrolysis by using a sinusoidal alternate current (VA=12.7V, VA=9.1V) in an aqueous solution of a nitric acid concentration of 1% at a temperature of 50° C. at an anodic electricity of 270 C/dm².

After washing with water once, the aluminum plate was etched at 0.3 g/m² by spraying an aqueous solution of a sodium hydroxide concentration of 25% at a temperature of 35° C. After washing with water, the plate was desmatted by spraying an aqueous solution of a sulfuric acid concentration of 30% at a temperature of 55° C. and washed with water again. The surface roughness of the aluminum plate thus obtained, which was measured with SURFCOM (manufactured by Tokyo Seimitsu) at a needle tip diameter of 2 μm, was 0.25 μm expressed in Ra. Subsequently, this aluminum plate was subjected to anode oxidation in an aqueous solution of a sulfuric acid concentration of 15% at a temperature of 40° C. and at a current density of 2A/dm² so as to give an aluminum oxide coating amount of 2.7 g/m². Thus, an aluminum plate having been subjected to the surface-hydrophilication treatment was obtained.

To the thus treated aluminum plate, first the following intermediate layer solution (1) was applied with the use of a bar coater and then dried at 80° C. for 20 sec. After drying the coating weight (mass) of the intermediate layer was 5 mg/m².

Intermediate Layer Solution (1)

| | |
|---|---|
| Low-molecular weight compound (Compound No. 1) | 0.1 g |
| Methanol | 100.0 g |

Then a photosensitive solution (1) of the following composition was applied thereon by using a bar coater and dried at 100° C. for 60 sec. After drying, the coating weight of the photosensitive layer was 1.3 g/m².

Photosensitive Solution (1)

| | |
|---|---|
| The following ethylenically unsaturated bond-having compound (A1) | 5 g |
| The following polymer (B1) | 4 g |

Polyurethane comprising 4,4'-diphenylmethane diisocyanate/hexamethylene diisocyanate/2,2-bis(hydroxymethyl) propionic acid/tetraethylene glycol/polypropylene glycol (degree of polymerization 20)=80/20/50/25/25 (molar ratio), weight-average molecular weight: $6.0 \times 10^4$.

| | |
|---|---|
| The following sensitizing dye (C1) | 0.2 g |
| The following polymerization initiator (D1) | 0.7 g |
| The following co-sensitizing agent | 1.2 g |
| Pigment dispersion | 3.5 g |

The dispersion had the following composition ratio.

| | |
|---|---|
| The following copper phthalocyanine pigment | 10% |
| Allyl methacrylate/ methacrylic acid-83/17 (molar ratio) copolymer | 15% |

-continued

| | |
|---|---|
| Cyclohexane | 15% |
| Methoxypropyl acetate | 20% |
| Propylene glycol monomethyl ether | 40% |

| | |
|---|---|
| Heat polymerization inhibitor (N-nitrosophenylhydroxylamine aluminum salt) | 0.15 g |
| MEGAFAC F-176 (manufactured by Dainippon Ink & Chemicals, surfactant) | 0.05 g |
| Methyl ethyl ketone | 90.0 g |
| Propylene glycol monomethyl ether | 60.0 g |

Ethylenically Unsaturated Bond-Containing Compound (A1)

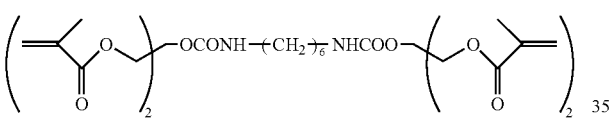

Sensitizing Dye (C1)

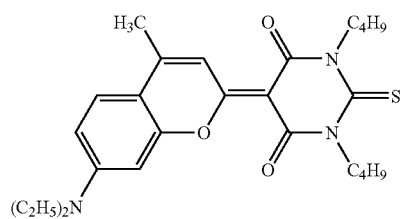

Polymerization Initiator (D1)

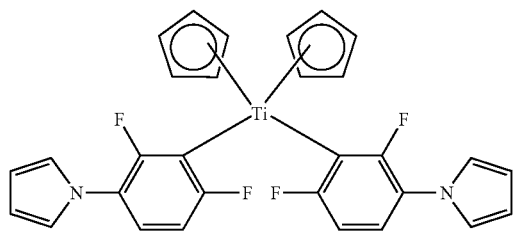

Co-Sensitizig Agent

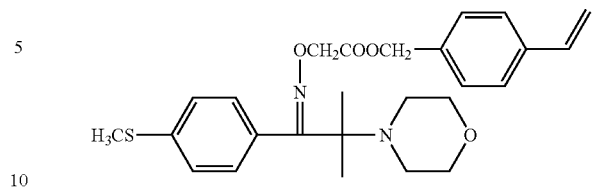

Copper Phthalocyanine Pigment

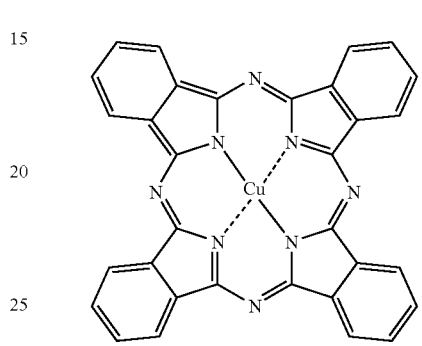

Further, a protective layer solution (1) of the following composition was applied thereon by using a bar coater and dried at 120° C. for 90 sec. After drying, the coating weight of the protective layer was 2.5 g/m².

Protective Layer Solution (1)

| | |
|---|---|
| Polyvinyl alcohol (degree of saponification 98% by mol, degree of polymerization 500) | 5.0 g |
| Polyvinylpyrrolidone | 0.3 g |
| Purified water | 100.0 g |

Example 2

The surface of an aluminum 1S plate of 0.30 mm in thickness was sand-blasted by using a nylon brush (No. 3) and an aqueous suspension of 400-mesh pumi stone and then sufficiently washed with water. Next, the aluminum plate was etched by spraying an aqueous solution of a sodium hydroxide concentration of 26% at a temperature of 70° C. thereto. Thus, the aluminum plate was etched at 10 g/m². Next, it was washed with running water, neutralized by washing with an aqueous solution of a nitric acid concentration of 1% at a temperature of 30° C. and then washed with water again. Then the surface of the plate was roughened by electrolysis by using a sinusoidal alternate current (VA=12.7V, VA=9.1V) in an aqueous solution of a nitric acid concentration of 1% at a temperature of 50° C. at an anodic electricity of 270 C/dm².

After washing with water once, the aluminum plate was etched at 0.8 g/m² by spraying an aqueous solution of a sodium hydroxide concentration of 25% at a temperature of 35° C. After washing with water, the plate was desmatted by spraying an aqueous solution of a sulfuric acid concentration of 30% at a temperature of 55° C. and washed with water again. The surface roughness of the aluminum plate thus obtained, which was measured with SURFCOM (manufactured by Tokyo Seimitsu) at a needle tip diameter of 2 A, was 0.48 μm expressed in Ra. Subsequently, this aluminum plate was subjected to anode oxidation in an aqueous solution of a sulfuric acid concentration of 15% by weight at a temperature of 40° C. and at a current density of 2A/dm$^2$ so as to give an aluminum oxide coating amount of 2.0 g/m$^2$. Thus, an aluminum plate having been subjected to the surface-hydrophilication treatment was obtained.

To the thus treated aluminum plate, first the following intermediate layer solution (2) was applied with the use of a bar coater and then dried at 80° C. for 20 sec. After drying the coating weight of the intermediate layer was 10 mg/m$^2$.

Intermediate Layer Solution (2)

| | |
|---|---|
| Low-molecular weight compound (Compound No. 2) | 0.1 g |
| Methanol | 100.0 g |

Then the photosensitive solution (1) of the above-described composition was applied thereon by using a bar coater and dried at 120° C. for 90 sec. After drying, the coating weight of the photosensitive layer was 1.6 g/m$^2$.

Moreover, the protective layer solution (1) of the above-described composition was applied thereon by using a bar coater and dried at 150° C. for 60 sec. After drying, the coating weight of the protective layer was 3.0 g/m$^2$.

Example 3

The surface of an aluminum 1S plate of 0.30 mm in thickness was sand-blasted by using a nylon brush (No. 3) and an aqueous suspension of 4000 mesh pumi stone and then sufficiently washed with water. Next, the aluminum plate was etched by spraying an aqueous solution of a sodium hydroxide concentration of 25% and an aluminum ion concentration of 6.5% at a temperature of 70° C. thereto. Thus, the aluminum plate was etched at 8 g/m$^2$ Next, it was washed with running water, neutralized by washing with an aqueous solution of a nitric acid concentration of 1% and an aluminum ion concentration of 0.5% at a temperature of 30° C. and then washed with water again. Then the surface of the plate was subjected to an electrolytic surface-roughening treatment (1) in the following manner. Namely, the treatment was carried out by using an aqueous solution of a nitric acid concentration of 1%, an aluminum ion concentration of 0.5% and an ammonium ion concentration of 0.01% by weight at a temperature of 50° C. as a liquid electrolyte and using a combination of a trapezoidal wave with a rectangular wave as an alternate current electrical source wave. The time TP required for the achievement of the peak current value from zero was 0.8 msec, the duty ratio was 1:1, the current density at the peak was 30 A/dm$^2$, and the electricity expressed in the total electricity at the point of using the aluminum plate as the anode was 220 C/dm$^2$. A carbon electrode was employed as a counter electrode, while ferrite was employed as a supporting anode. 5% of the current flowing from the electric source was shunted.

After washing with water once, the aluminum plate was etched at 0.3 g/m$^2$ by spraying an aqueous solution of a sodium hydroxide concentration of 25% and an aluminum ion concentration of 10% at a temperature of 35° C. After washing with water, the plate was desmatted by spraying an aqueous solution of a sulfuric acid concentration of 15% and an aluminum ion concentration of 4.5% at a temperature of 30° C. and washed with water again. Further, it was subjected to another electrolytic surface-roughening treatment (2) in the following manner. Namely, the treatment was carried out by using an aqueous solution of a hydrochloric acid concentration of 1% and an aluminum ion concentration of 0.5% at a temperature of 35° C. as a liquid electrolyte and using a combination of a trapezoidal wave with a rectangular wave as an alternate current electrical source wave. The time TP required for the achievement of the peak current value from zero was 0.8 msec, the duty ratio was 1:1, the current density at the peak was 25 A/dm$^2$, and the electricity expressed in the total electricity at the point of using the aluminum plate as the anode was 50 C/dm$^2$. A carbon electrode was employed as a counter electrode, while ferrite was employed as a supporting anode. 5% of the current flowing from the electric source was shunted.

After washing with water once, the aluminum plate was etched at 0.1 g/m$^2$ by spraying an aqueous solution of a sodium hydroxide concentration of 30% and an aluminum ion concentration of 5% at a temperature of 30° C. After washing with water, the plate was desmatted by spraying an aqueous solution of a sulfuric acid concentration of 30% and an aluminum ion concentration of 0.5% at a temperature of 55° C. and washed with water again. The surface roughness of the aluminum plate thus obtained, which was measured with SURFCOM (manufactured by Tokyo Seimitsu) at a needle tip diameter of 2 μm, was 0.60 μm expressed in Ra. Subsequently, this aluminum plate was subjected to anode oxidation in an aqueous solution of a sulfuric acid concentration of 15% and an aluminum ion concentration of 0.5% at a temperature of 40° C. and at a current density of 2A/dm$^2$ so as to give an aluminum oxide coating amount of 2.7 g/m$^2$. Thus, an aluminum plate having been subjected to the surface-hydrophilication treatment was obtained.

To the thus treated aluminum plate, first the following intermediate layer solution (3) was applied with the use of a bar coater and then dried at 80° C. for 20 sec. After drying the coating weight of the intermediate layer was 20 mg/m$^2$.

Intermediate Layer Solution (3)

| | |
|---|---|
| Low-molecular weight compound (Compound No. 3) | 0.1 g |
| Methanol | 100.0 g |

Then the photosensitive solution (1) of the above-described composition was applied thereon by using a bar coater and dried at 100° C. for 90 sec. After drying, the coating weight of the photosensitive layer was 1.0 g/m$^2$.

Moreover, the protective layer solution (1) of the above-described composition was applied thereon by using a bar coater and dried at 110° C. for 60 sec. After drying, the coating weight of the protective layer was 2.0 g/m$^2$.

Examples 4 to 24

A photosensitive lithographic printing plate was obtained as in Example 1 but altering the low-molecular weight compound to be used in the intermediate layer, the coating amount of the intermediate layer, and the ethylenically unsaturated bond-containing compound, the polymer, the sensitizing dye and the polymerization initiator to be used in the photosensitive layer each as specified in Table 1.

| | Low-molecular weight compound | Intermediate layer coating amount (mg/m²) | Ethylenically unsaturated bond-containing compound | Polymer | Sensitizing dye | Polymerization initiator |
|---|---|---|---|---|---|---|
| Ex. 1 | Cpd. No. 1 | 5 | A1 | B1 | C1 | D1 |
| Ex. 2 | Cpd. No. 2 | 10 | A1 | B1 | C1 | D1 |
| Ex. 3 | Cpd. No. 3 | 20 | A1 | B1 | C1 | D1 |
| Ex. 4 | Cpd. No. 4 | 5 | A1 | B1 | C1 | D1 |
| Ex. 5 | Cpd. No. 6 | 30 | A1 | B1 | C1 | D1 |
| Ex. 6 | Cpd. No. 7 | 5 | A1 | B1 | C1 | D1 |
| Ex. 7 | Cpd. No. 8 | 15 | A1 | B1 | C1 | D1 |
| Ex. 8 | Cpd. No. 10 | 5 | A1 | B1 | C1 | D1 |
| Ex. 9 | Cpd. No. 11 | 2 | A1 | B1 | C1 | D1 |
| Ex. 10 | Cpd. No. 12 | 5 | A1 | B1 | C1 | D1 |
| Ex. 11 | Cpd. No. 4 | 10 | A2 | B2 | C1 | D1 |
| Ex. 12 | Cpd. No. 6 | 10 | A2 | B2 2 g B3 2 g | C1 | D1 |
| Ex. 13 | Cpd. No. 8 | 10 | A1 | B1 | C2 | D1 |
| Ex. 14 | Cpd. No. 10 | 10 | A2 | B2 3.5 g B3 0.5 g | C2 | D1 |
| Ex. 15 | Cpd. No. 11 | 10 | A1 | B1 1.5 g B3 2.5 g | C2 | D1 |
| Ex. 16 | Cpd. No. 12 | 10 | A2 | B1 3 g B2 1 g | C2 | D2 |
| Ex. 17 | Cpd. No. 13 | 10 | A1 | B1 | C1 | D1 |
| Ex. 18 | Cpd. No. 14 | 50 | A1 | B1 | C1 | D1 |
| Ex. 19 | Cpd. No. 15 | 20 | A1 | B1 | C2 | D1 |
| Ex. 20 | Cpd. No. 16 | 1 | A1 | B1 | C1 | D1 |
| Ex. 21 | Cpd. No. 17 | 80 | A1 | B1 | C1 | D1 |
| Ex. 22 | Cpd. No. 18 | 2 | A1 | B1 | C2 | D1 |
| Ex. 23 | Cpd. No. 20 | 15 | A1 | B1 | C1 | D1 |
| Ex. 24 | Cpd. No. 21 | 10 | A1 | B1 | C1 | D1 |

The structures of individual compounds given in Table 1 are as follows.

Ethylenically Unsaturated Bond-Containing Compound (A2)

$(H_2C=CHCOO)_4—C$

Polymer (B2)

Copolymer of allyl methaorylate/N-isopropylacrylamide/methacrylic acid=65/15/20 (molar ratio), weight-average molecular weight $8.0 \times 10^4$.

Polymer (B3)

Copolymer of allyl methacrylate/methacrylic acid=83/17 (molar ratio), weight-average molecular weight: $10.0 \times 10^4$.

Sensitizing Dye (C2)

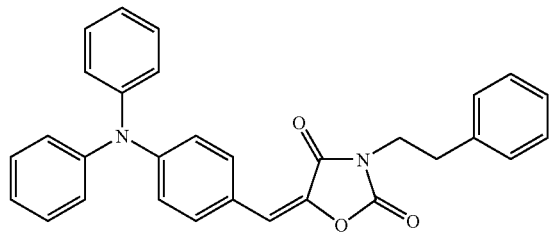

Polymerization Initiator (D2)

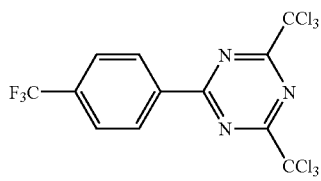

Comparative Example 1

A photosensitive lithographic printing plate was obtained as in Example 1 but forming no intermediate layer.

Comparative Example 2

A photosensitive lithographic printing plate was obtained as in Example 1 but using an intermediate layer solution (4) as the intermediate layer.

Intermediate Layer Solution (4)

| | |
|---|---|
| The following sol | 100 g |
| Methanol | 900 g |
| Sol | |
| Phosmer PE (manufactured by Uni-Chemical) | 5 g |
| Methanol | 45 g |
| Water | 10 g |
| 85% phosphoric acid | 5 g |

-continued

| | |
|---|---|
| Tetraethoxysilane | 20 g |
| 3-Methacryloxy-propyltrimethoxysilane | 15 g |

Comparative Example 3

A photosensitive lithographic printing plate was obtained as in Example 1 but using an intermediate layer solution (5) as the intermediate layer.

Intermediate Layer Solution (5)

| | |
|---|---|
| The following compound (compound described in JP-A-9-34104) | 0.1 g |

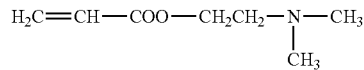

| | |
|---|---|
| Methanol | 100 g |

Using the photosensitive lithographic printing plates obtained in the above Examples 1 to 12, 17, 18, 20, 21, 23 and 24 and Comparative Examples 1 to 3, solid images and 1 to 99% halftone images (intervals: 1%) were subjected to scanning exposure with the use of PLATE JET4 (manufactured by CSI) equipped with an FD-YAG laser at an exposure light dose of 140 μJ/cm² and at a resolution of 1000 dpi at 100 lines/inch. Using the photosensitive lithographic printing plates obtained in the above Examples 13 to 16, 19 and 22, solid images and 1 to 99% halftone images (intervals; 1%) were subjected to scanning exposure with the use of an inner drum type setter for laboratory use (Violet LD) equipped with 405 nm semiconductor laser (output 30 mW) at an exposure light dose of 50 μJ/m² and at a resolution of 4000 dpi at 175 lines/inch.

Next, lithographic printing plates were obtained by treating the above samples with the use of an automatic developing machine LP-850P2 (manufactured by Fuji Photo Film Co.). The automatic developing machine LP-850P2 is a developing machine by which preheating, water-washing of protective layer, development, water-washing and gumming are carried out in this order. The treating conditions were as follows, i.e., preheating was carried out until the plate temperature attained 110° C. and a dilution (1:1) of FP-2W (manufactured by Fuji Photo Film Co.) with water was employed as a gumming solution.

As the developing solution, the following developing solutions (1) and (2) were respectively employed.

Developing Solution (1)

| | |
|---|---|
| Potassium hydroxide | 5 g |
| Polyoxyethylene phenyl ether (n=13) | 30 g |
| Chelest 400 (chelating agent) | 1 g |
| Water | 964 g |

At 25° C., the developing solution (1) had a pH value of 11.8 and an electric conductivity of 5 mS/cm.

Developing Solution (2)

| | |
|---|---|
| 1K-Potassium silicate | 20 g |
| Potassium hydroxide | 1 g |
| Polyoxyethylene phenyl ether (n = 10) | 70 g |
| Chelest 400 (chelating agent) | 1 g |
| Sodium sulfite | 5 g |
| Water | 903 g |

At 25° C., the developing solution (2) had a pH value of 12.5 and an electric conductivity of 20 mS/cm.

The development properties in these treatments were confirmed. The term "development properties" as used herein means the extent of the removal of the unexposed parts in the treatments involving the development. That is to say, "good" means that the unexposed parts can well removed, while "residue" means that the unexposed parts cannot be well removed.

The photosensitive lithographic printing plates thus obtained were loaded on a printing press LITHRONE (manufactured by Komori Co.) and printing was carried out. In this step, an aqueous solution containing 5% of isopropyl alcohol and 1% of an etching solution EU-3 (manufactured by Fuji Photo Film Co.) was used as dampening water and an link GEOS-G (manufactured by Dainippon Ink & Chemicals) was used. After printing 1000 sheets, the stain resistance of the printed matters and the printing tolerance after continuing printing were examined.

The term "stain resistance" as used herein means whether or not the ink adhered during printing to parts which should inherently remain unprinted. That is to say, "stained" means no favorable printed matter can be obtained. The "printing tolerance" is represented by the number of sheets having been used until a favorable printed matter cannot be obtained any more since the ink fails to adhere or only thin ink spots are formed in the parts of printed matters where the ink is to be adhered. That is to say, a larger number indicates the better printing tolerance.

Table 2 summarizes these results.

TABLE 2

| Printing plate | DPE properties | | Stain resistance | | Printing tolerance | |
|---|---|---|---|---|---|---|
| | DPE. solution (1) | DPE. solution (2) | DPE. solution (1) | DPE. solution (2) | DPE. solution (1) | DPE. solution (2) |
| Ex. 1 | Good | Good | No | No | 10.5 × 10⁴ | 10.5 × 10⁴ |
| Ex. 2 | Good | Good | No | No | 11.5 × 10⁴ | 12.0 × 10⁴ |
| Ex. 3 | Good | Good | No | No | 10.0 × 10⁴ | 10.5 × 10⁴ |
| Ex. 4 | Good | Good | No | No | 11.0 × 10⁴ | 11.0 × 10⁴ |
| Ex. 5 | Good | Good | No | No | 10.5 × 10⁴ | 11.0 × 10⁴ |
| Ex. 6 | Good | Good | No | No | 11.5 × 10⁴ | 12.0 × 10⁴ |
| Ex. 7 | Good | Good | No | No | 11.0 × 10⁴ | 11.0 × 10⁴ |
| Ex. 8 | Good | Good | No | No | 11.5 × 10⁴ | 11.5 × 10⁴ |
| Ex. 9 | Good | Good | No | No | 10.5 × 10⁴ | 10.5 × 10⁴ |
| Ex. 10 | Good | Good | No | No | 10.5 × 10⁴ | 10.5 × 10⁴ |
| Ex. 11 | Good | Good | No | No | 11.0 × 10⁴ | 11.5 × 10⁴ |
| Ex. 12 | Good | Good | No | No | 10.5 × 10⁴ | 10.5 × 10⁴ |
| Ex. 13 | Good | Good | No | No | 11.0 × 10⁴ | 11.5 × 10⁴ |
| Ex. 14 | Good | Good | No | No | 11.0 × 10⁴ | 11.5 × 10⁴ |
| Ex. 15 | Good | Good | No | No | 10.5 × 10⁴ | 10.5 × 10⁴ |
| Ex. 16 | Good | Good | No | No | 11.0 × 10⁴ | 11.5 × 10⁴ |
| Ex. 17 | Good | Good | No | No | 11.0 × 10⁴ | 11.0 × 10⁴ |
| Ex. 18 | Good | Good | No | No | 11.0 × 10⁴ | 11.0 × 10⁴ |
| Ex. 19 | Good | Good | No | No | 10.5 × 10⁴ | 10.5 × 10⁴ |
| Ex. 20 | Good | Good | No | No | 9.5 × 10⁴ | 10.0 × 10⁴ |
| Ex. 21 | Good | Good | No | No | 9.0 × 10⁴ | 9.0 × 10⁴ |
| Ex. 22 | Good | Good | No | No | 11.0 × 10⁴ | 11.5 × 10⁴ |

TABLE 2-continued

| Printing plate | DPE properties | | Stain resistance | | Printing tolerance | |
|---|---|---|---|---|---|---|
| | DPE. solution (1) | DPE. solution (2) | DPE. solution (1) | DPE. solution (2) | DPE. solution (1) | DPE. solution (2) |
| Ex. 23 | Good | Good | No | No | $10.5 \times 10^4$ | $11.0 \times 10^4$ |
| Ex. 24 | Good | Good | No | No | $11.0 \times 10^4$ | $11.0 \times 10^4$ |
| C. Ex. 1 | Good | Good | No | No | $3.5 \times 10^4$ | $3.5 \times 10^4$ |
| C. Ex. 2 | Residue | Residue | Stained | Stained | $8.0 \times 10^4$ | $8.0 \times 10^4$ |
| C. Ex. 3 | Good | Good | No | No | $4.5 \times 10^4$ | $4.0 \times 10^4$ |

As Table 2 shows, the sample of Comparative Example 1 having no intermediate layer and the sample of Comparative Example 3 containing no low-molecular weight compound according to the invention in the intermediate layer showed poor printing tolerance. In the sample of Comparative Example 2 having a sol-gel intermediate layer, the non-image parts could not be completely removed at the development and suffered from stains.

In contrast, each of the lithographic printing plates constructed in accordance with the invention showed good development properties without any stains and favorable printing tolerance.

According to the present invention, it is possible to obtain a photosensitive lithographic printing plate which is suitable for laser drawing and has excellent printing tolerance in an image part as well as excellent development properties and stain resistance in a non-image part.

This application is based on Japanese Patent application JP 2003-6094, filed Jan. 14, 2003, the entire content of which is hereby incorporated by reference, the same as if set forth at length.

What is claimed is:

1. A photosensitive lithographic printing plate comprising:
   a substrate having a hydrophilic surface;
   an intermediate layer which contains a compound having a quaternary ammonium group and an acid anion group covalently bonded in a single molecule and having a molecular weight of 2000 or less; and
   a photopolymerizable photosensitive layer,
   in this order.

2. The photosensitive lithographic printing plate according to claim 1, wherein the compound is represented by the following formula (1):

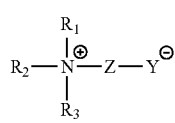

(1)

wherein $R_1$, $R_2$ and $R_3$ each independently represent an optionally substituted alkyl group, Z represents a divalent linking group, and Y represents an acid anion group.

3. The photosensitive lithographic printing plate according to claim 1, wherein the photopolymerizable photosensitive layer contains a compound having an ethylenically unsaturated bond capable of undergoing addition polymerization, a photopolymerization initiator and a polymer binder.

4. The photosensitive lithographic printing plate according to claim 3, wherein the photopolymerization initiator is at least one compound selected from titanocene compounds and triazine compounds.

5. The photosensitive lithographic printing plate according to claim 1, wherein the intermediate layer contains the compound in an amount of 20% by weight or more.

6. The photosensitive lithographic printing plate according to claim 1, wherein the hydrophilic surface of the substrate has a surface roughness of from 0.1 to 1.0 μm.

7. The photosensitive lithographic printing plate according to claim 1, which further comprises a protective layer.

8. The photosensitive lithographic printing plate according to claim 7, wherein the protective layer is an oxygen barrier protective layer containing a water-soluble vinyl polymer and the substrate, the intermediate layer, the photopolymerizable photosensitive layer and the oxygen barrier protective layer are provided in this order.

9. A photosensitive lithographic printing plate comprising:
   a substrate having a hydrophilic surface;
   an intermediate layer which contains a compound having a quaternary ammonium group and an acid anion group in a single molecule; and
   a photopolymerizable photosensitive layer,
   in this order,
   wherein the compound is represented by the following formula (1):

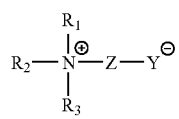

(1)

wherein $R_1$, $R_2$ and $R_3$ each independently represents an optionally substituted alkyl group, Z represents a divalent linking group, and Y represents an acid anion group.

10. The photosensitive lithographic printing plate according to claim 9, wherein the compound has a molecular weight of 2000 or less.

11. The photosensitive lithographic printing plate according to claim 9, wherein the photopolymerizable photosensitive layer contains a compound having an ethylenically unsaturated bond capable of undergoing addition polymerization, a photopolymerization initiator and a polymer binder.

12. The photosensitive lithographic printing plate according to claim 11, wherein the photopolymerization initiator is at least one compound selected from titanocene compounds and triazine compounds.

13. The photosensitive lithographic printing plate according to claim 9, wherein the intermediate layer contains the compound in an amount of 20% by weight or more.

14. The photosensitive lithographic printing plate according to claim 9, wherein the hydrophilic surface of the substrate has a surface roughness of from 0.1 to 1.0 μm.

15. The photosensitive lithographic printing plate according to claim 9, which further comprises a protective layer.

16. The photosensitive lithographic printing plate according to claim 15, wherein the protective layer is an oxygen barrier protective layer containing a water-soluble vinyl polymer and the substrate, the intermediate layer, the photopolymerizable photosensitive layer and the oxygen barrier protective layer are provided in this order.

* * * * *